United States Patent [19]

Chan

[11] Patent Number: 5,012,128
[45] Date of Patent: Apr. 30, 1991

[54] HIGH SPEED PUSH-PULL DRIVER HAVING CURRENT MIRROR PULL-DOWN

[75] Inventor: Yuen H. Chan, Poughkeepsie, N.Y.

[73] Assignee: International Business Machines Corporation, Armonk, N.Y.

[21] Appl. No.: 469,116

[22] Filed: Jan. 24, 1990

[51] Int. Cl.$^5$ ...................... H03K 3/01; H03K 19/086
[52] U.S. Cl. ...................... 307/270; 307/455; 307/456; 307/491; 307/362; 307/310; 330/257; 330/288
[58] Field of Search ........ 307/310, 362, 443, 454–456, 307/491, 270, 263; 330/257, 288

[56] References Cited

U.S. PATENT DOCUMENTS

| | | | |
|---|---|---|---|
| 4,276,485 | 6/1981 | Rydval | 307/215 |
| 4,490,630 | 12/1984 | Freeman | 307/270 |
| 4,539,493 | 9/1985 | Varadarajan | 307/455 |
| 4,559,458 | 12/1985 | Ma | 307/443 |
| 4,626,709 | 12/1986 | Maxumder et al. | 307/455 |
| 4,636,665 | 1/1987 | McLaughlin | 307/491 |
| 4,906,869 | 3/1990 | Masuoka | 307/263 |

OTHER PUBLICATIONS

IBM Technical Disclosure Bulletin, vol. 24, No. 1B, Jun. 1981, p. 511—Emitter Coupled Logic Gate with a Dual Current Source, H. Beranger et al.
IBM Technical Disclosure Bulletin–vol. 19, No. 12, May 1977, pp. 4614–4615, Complementary Driver for Emitter–Coupled–Logic Gates by A. W. Chang et al.
IBM Technical Disclosure Bulletin, vol. 25, No. 10, Mar. 1983, Array Word/Bit Line Driver by F. J. Crispi et al.

Primary Examiner—Stanley D. Miller
Assistant Examiner—Margaret Rose Wambach
Attorney, Agent, or Firm—John D. Crane; Richard A. Romanchik

[57] ABSTRACT

A push-pull driver circuit is disclosed comprising two stages. The first stage includes a current switch producing a dual phase output. The second stage includes a first emitter follower for output pull-up and a second emitter follower and a current mirror for output pull-down. The inputs of the first and second emitter followers are connected to respective output phases of the first stage. The outputs of the emitter followers are connected to respective terminals of the current mirror. The output of the second emitter follower also is connected to the output line being driven. A fixed biasing source maintains the current mirror transistors in conductive states at all times. Schottky diodes are connected to the current mirror transistors to prevent saturation.

9 Claims, 1 Drawing Sheet

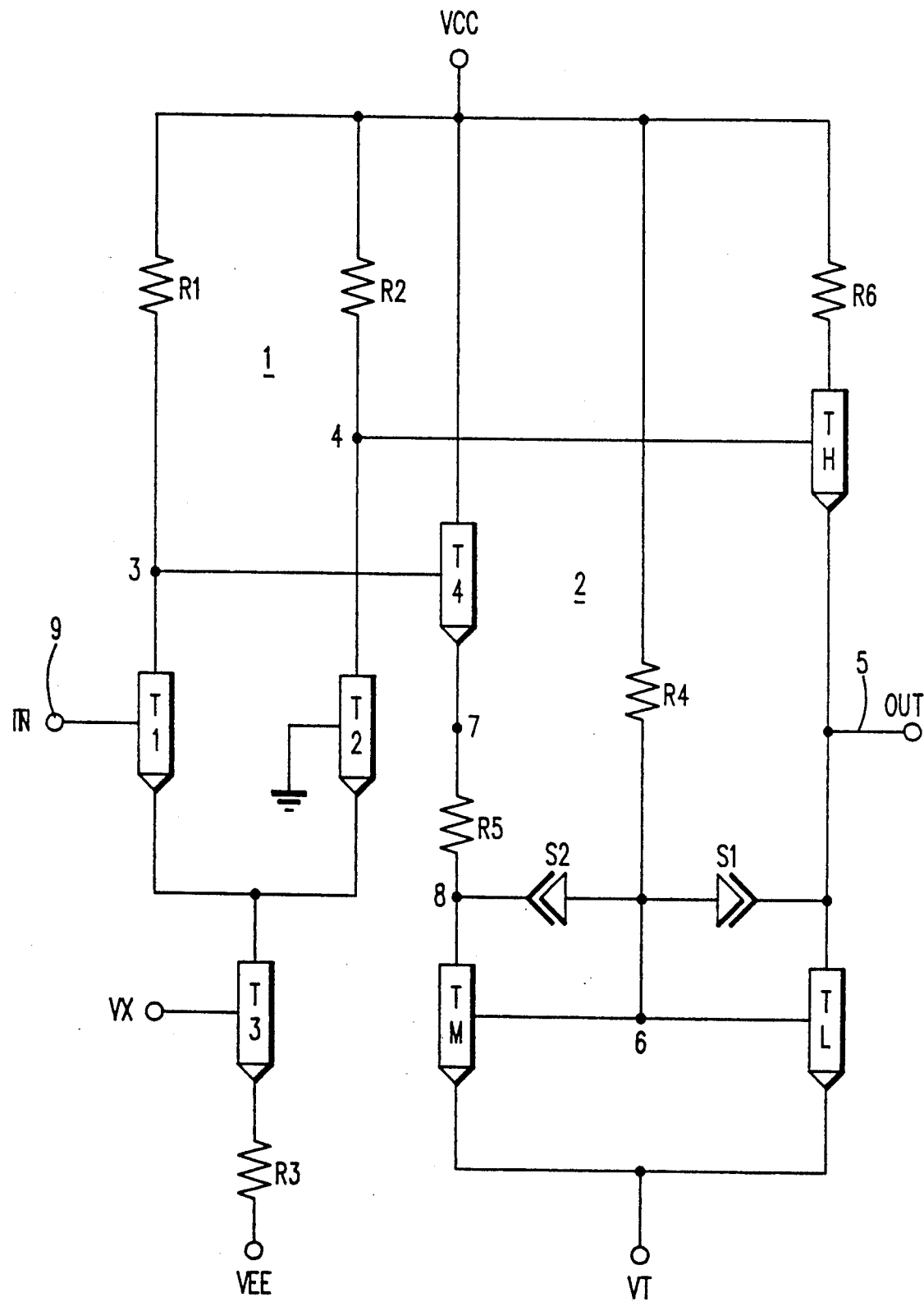

HIGH SPEED PUSH-PULL DRIVER HAVING CURRENT MIRROR PULL-DOWN

BACKGROUND OF THE INVENTION

The present invention generally relates to high performance push-pull drivers for use in logic and memory array chips and, more particularly, to such a driver in which the output negative-going transition is made substantially as fast as the positive-going transition.

High performance push-pull drivers are desired in logic and memory array chips because of their superior driving capabilities with capacitance-loaded lines. However, such state-of-the-art drivers in use today suffer a common problem. That is, the output negative-going transition is slower than the up-going one. Such a performance problem often is due to the fact that the open collector pull-down transistor in a conventional design is biased to shut off (or nearly so) when the output is high. More time is required to turn on or to bias up the conduction of the pull-down transistor when compared to the time required to turn on the emitter follower conventionally used as the pull-up transistor. The result is non-symmetrical turn ON and turn OFF circuit delays whereby overall circuit speed is impacted.

For example, in U.S. Pat. No. 4,559,458, for Temperature Tracking and Supply Voltage Independent Line Driver for ECL Circuits, issued in the name of Bing-Fong Ma on Dec. 17, 1985, a pull down transistor pair is quiescently biased to low standby current. A transition detection circuit increasingly biases said transistor pair into heavy conduction only during high-to-low transitions. At all other times, the pull-down device is biased downwardly to deliver a low standby current to reduce dc power dissipation.

SUMMARY OF THE INVENTION

One object of the present invention is to eliminate the turn on delay associated with prior art pull-down transistor devices.

Another object is to provide a pull-down transistor device whose conduction can be increased without increasing the quiescent bias thereon.

A further object is to provide a pull-down transistor device utilizing the switching of a fixed bias current between two different current mirror circuit paths to initiate pull-down operation.

Another object is to turn on a pull down transistor device without altering the magnitude of the bias current applied thereto.

In accordance with the present invention, a push-pull driver circuit is provided comprising two stages. The first stage preferably includes a current switch receiving one or more inputs and producing a dual phase output. The second stage includes a first emitter follower for output pull-up and a second emitter follower and current mirror configuration for output pull-down. The inputs of said first and second emitter followers are connected to respective output phases of the first stage. The outputs of the emitter followers are connected to respective terminals of the current mirror. The output of the second emitter follower also is connected to the output line being driven. A fixed biasing current source maintains the transistors of the current mirror in conductive states at all times. Clamps are provided to prevent saturation in the current mirror transistors.

In operation, the dual phase outputs, in combination with the two emitter followers and biasing source steer the fixed biasing current to one side of the current mirror or the other. Biasing current, when directed to one side of the current mirror, produces the rapid pull down of the output line while diversion of the biasing current to the other side permits fast pull up of the output line. Turn-ON/turn-OFF delays due to changes in pull-down transistor biasing levels are eliminated.

BRIEF DESCRIPTION OF THE DRAWINGS

The sole figure is a simplified schematic diagram of a preferred embodiment of the present invention.

BEST MODE FOR CARRYING OUT THE INVENTION

The push-pull driver circuit of the figure comprises an input stage 1 and an output stage 2. Input stage 1 includes an emitter coupled logic (ECL) circuit comprising transistors T1, T2 and T3 resistors R1, R2 and R3 and voltage sources VX, VCC and VEE. An input switching signal is applied to the base of T1. Out-of-phase and in-phase output signals are provided at nodes 3 and 4, respectively. It should be noted that other than ECL logic circuit technologies such as transistor-to-transistor (TTL) logic or complementary metal-oxide-semiconductor (CMOS) logic may be used to implement input stage 1.

Output stage 2 includes emitter follower TH for output pull-up and a current mirror configuration including TM and TL and emitter follower T4 for output pull-down. The pull-up emitter follower TH is connected to the in-phase signal at node 4 whereas emitter follower T4 of the current mirror configuration is connected to the out-of-phase signal at node 3. Such connections generate a non-inverting function at the output line 5. Simply by interchanging the connections of TH and T4 to input stage 1, an inverting function can be provided at the output line 5 for applications where inversion is desired.

In order to eliminate turn-ON/turn-OFF delays, the current mirror devices TM and TL are biased by VCC, R4 and VT to be in an active conduction mode at all times. A constant current bias is applied to the bases of TM and TL at node 6 to maintain them ON. Schottky diodes S1 and S2 across the collector-base of TL and TM, respectively, are used to steer excessive bias currents away and prevent saturation of TL and TM. Resistor R5 and R6 are used for output short circuit protection. Resistor R5 is inserted between nodes 7 and 8 to limit the pull-down current in TL and resistor R6 is introduced in the collector circuit of TH to limit the pull-up current.

In operation, when the relative input voltage transition at input 9 is from a low value to a high value, transistor T1 is turned ON and transistor T2 is turned OFF pulling node 3 low and node 4 high. With node 3 switched low, transistor T4 is shut OFF, allowing node 8 to go low to restrict high current flow in the mirror devices TM and TL. While T4 is being shut OFF, node 4 rises and the emitter follower TH is being turned ON to raise output line 5.

As node 8 sinks to its down level (i.e., a Vce above VT), Schottky diode S2 is turned ON. The bias current from resistor R4 is then steered into the mirror transistor TM through Schottky diode S2. The same amount of current is mirrored into TL to maintain it in an active state.

When the relative input voltage transition at input 9 is from a high value to a low value, transistor T1 is turned OFF and transistor T2 is turned ON. Node 3 is raised high and node 4 is pulled low, turning ON transistor T4 and shutting OFF the emitter follower TH, respectively. When T4 is being turned ON, node 7 is raised high and a large transient current is fed from T4 through resistor R5 into the current mirror transistor TM. The same amount of high transient current is mirrored into TL to pull the output line 5 down rapidly. As the output line reaches its full down level, Schottky diode S1 turns ON to steer excessive bias current away from TL and prevent saturation in TL. At this state, TL and TM both conduct in active mode with the same amount of dc current.

The push-pull driver of the present invention can be adapted to meet various desired driver characteristics. For example, the emitter area ratio for the current mirror transistors TM and TL may be tailored to optimize dI/dT. Alternative up/down level clamps (in lieu of the Schottky diodes S1 and S2) can be substituted to control output levels and prevent saturation in TM and TL. Slow down capacitance and tri-state functioning can also be added, if needed.

While the present invention has been disclosed in connection with the preferred embodiment thereof, it should be understood that there by may be other embodiments which fall within the spirit and scope of the invention as defined by the following claims.

What is claimed is:

1. A driver circuit comprising a source of dual phase switching signals, one of said signal phases providing a relative voltage transition from a low value to a high value while the other of said signal phases provides a relative voltage transition from a high value to a low value,
   a first emitter follower transistor connected to receive said one signal phase,
   a second emitter follower transistor connected to receive said other signal phase,
   a current mirror comprising third and fourth transistors having commonly connected emitters and commonly connected bases,
   the emitter of said first emitter follower being connected to the collector of said third transistor,
   the emitter of said second emitter follower being connected to the collector of said fourth transistor,
   a biasing current source connected to said third and fourth transistors for biasing said third and fourth transistors in conductive states at all times, and
   means connected to said third and fourth transistors for preventing saturation therein.

2. The driver of claim 1 wherein said saturation preventing means are first and second Schottky diodes, each diode being connected across the collector and base terminals of a respective one of said third and fourth transistors.

3. The driver of claim 1 wherein said biasing current source includes a resistor and a voltage source, said resistor connecting said voltage source to said base terminals of said third and fourth transistors.

4. The driver of claim 1 wherein said dual phase switching signal source comprises a current switch receiving at least one input signal and producing said dual phase signals at respective output terminals.

5. The driver of claim 1 and further including a first current limiting resistor connected between the emitter of said first transistor and the collector of said third transistor.

6. The driver of claim 1 and further including a second current limiting resistor connected in series circuit with the collector current path of said second transistor.

7. A driver circuit comprising a source of dual phase switching signals, one of said signal phases providing a relative voltage transition from a low value to a high value while the other of said signal phases provides a relative voltage transition from a high value to a low value,
   a first emitter follower transistor connected to receive said one signal phase,
   a second emitter follower transistor connected to receive said other signal phase,
   a current mirror comprising third and fourth transistors having commonly connected emitters and commonly connected bases,
   the emitter of said first emitter follower being connected to the collector of said third transistor,
   the emitter of said second emitter follower being connected to the collector of said fourth transistor,
   a biasing current source connected to said third and fourth transistors for biasing said third and fourth transistors in conductive states at all times,
   first and second Schottky diodes, each diode being connected across the collector and base terminals of a respective one of said third and fourth transistors, and
   a first resistor connected between the emitter of said first transistor and the collector of said third transistor.

8. A driver circuit comprising a source of dual phase switching signals, one of said signal phases providing a relative voltage transition from a low value to a high value while the other of said signal phases provides a relative voltage transition from a high value to a low value,
   a first emitter follower transistor connected to receive said one signal phase,
   a second emitter follower transistor connected to receive said other signal phase,
   a current mirror comprising third and fourth transistors having commonly connected emitters and commonly connected bases,
   the emitter of said first emitter follower being connected to the collector of said third transistor,
   the emitter of said second emitter follower being connected to the collector of said fourth transistor,
   a biasing current source connected to said third and fourth transistors for biasing said third and fourth transistors in conductive states at all times,
   first and second Schottky diodes, each diode being connected across the collector and base terminals of a respective one of said third and fourth transistors,
   a first resistor connected between the emitter of said first transistor and the collector of said third transistor and
   a second resistor connected in series circuit with the collector current path of said second transistor.

9. The driver of claim 8 wherein said dual phase switching signal source comprises a current switch receiving at least one input signal and producing said dual phase signals at respective output terminals.

* * * * *